(12) United States Patent
Flader

(10) Patent No.: US 11,174,151 B2
(45) Date of Patent: Nov. 16, 2021

(54) INTEGRATED MEMS CAVITY SEAL

(71) Applicant: INVENSENSE, INC., San Jose, CA (US)

(72) Inventor: Ian Flader, Redwood City, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/688,051

(22) Filed: Nov. 19, 2019

(65) Prior Publication Data

US 2021/0147218 A1    May 20, 2021

(51) Int. Cl.
*B81B 7/00* (2006.01)
*B81C 1/00* (2006.01)

(52) U.S. Cl.
CPC .......... *B81B 7/0035* (2013.01); *B81B 7/0032* (2013.01); *B81B 7/0061* (2013.01); *B81B 7/0074* (2013.01); *B81C 1/00261* (2013.01); *B81C 1/00373* (2013.01); *B81B 2201/0235* (2013.01); *B81B 2201/0242* (2013.01); *B81B 2207/09* (2013.01); *B81C 2203/0154* (2013.01)

(58) Field of Classification Search
CPC .......... B81B 7/0035; B81B 2201/0235; B81B 2201/0242; B81B 7/0032; B81B 7/0061; B81B 7/0074; B81B 2207/09; B81C 1/00261; B81C 2203/0154
See application file for complete search history.

(56) References Cited

U.S. PATENT DOCUMENTS

| 10,392,244 | B2 | 8/2019 | Hung et al. |
| 2009/0205371 | A1* | 8/2009 | Chen ................... B81C 1/00293 65/36 |
| 2010/0102678 | A1* | 4/2010 | Saita ................... H03H 9/1035 310/344 |
| 2014/0002964 | A1 | 1/2014 | Li |
| 2014/0227816 | A1* | 8/2014 | Zhang ................. B81B 7/0041 438/48 |
| 2016/0244325 | A1* | 8/2016 | Cheng ..................... B81B 7/02 |
| 2018/0257929 | A1 | 9/2018 | Daneman |
| 2019/0112182 | A1 | 4/2019 | Metzger-Brueckl |
| 2019/0161346 | A1* | 5/2019 | Lee ..................... B81C 1/00293 |

FOREIGN PATENT DOCUMENTS

| EP | 3184486 | 6/2017 |
| EP | 3492423 | 6/2019 |

* cited by examiner

*Primary Examiner* — Feifei Yeung Lopez
(74) *Attorney, Agent, or Firm* — Haley Guiliano LLP; Joshua V. Van Hoven; Stefan D. Osterbur

(57) ABSTRACT

A microelectromechanical (MEMS) system may comprise multiple sensors within cavities of the MEMS system. The operation of different sensors requires different pressures within the respective cavities. A first cavity may be sealed at a first pressure. A through-hole may be etched into a cap layer of the MEMS system to introduce gas into a second cavity such that the cavity has a desired pressure. The cavity may then be sealed by a MEMS valve to maintain the desired pressure in the second cavity.

17 Claims, 6 Drawing Sheets

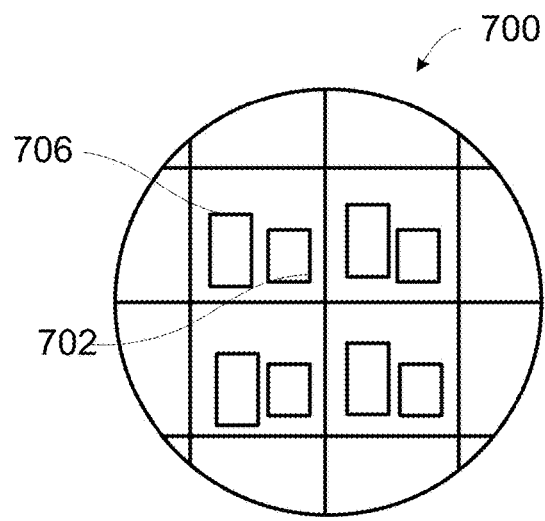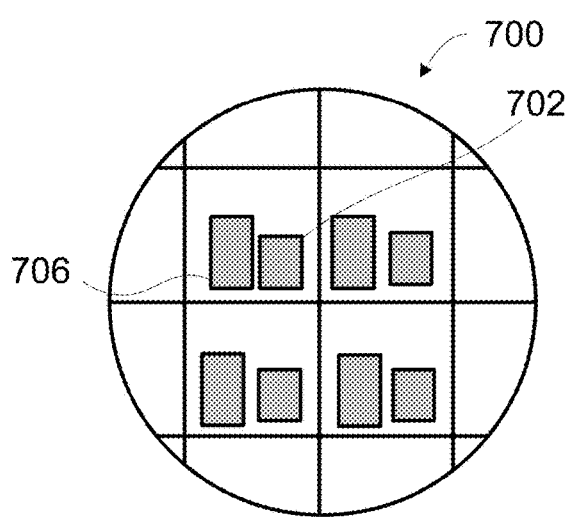
FIG. 7A  FIG. 7B
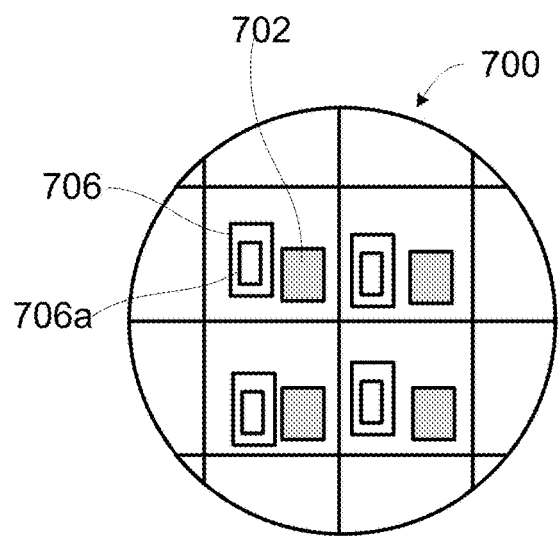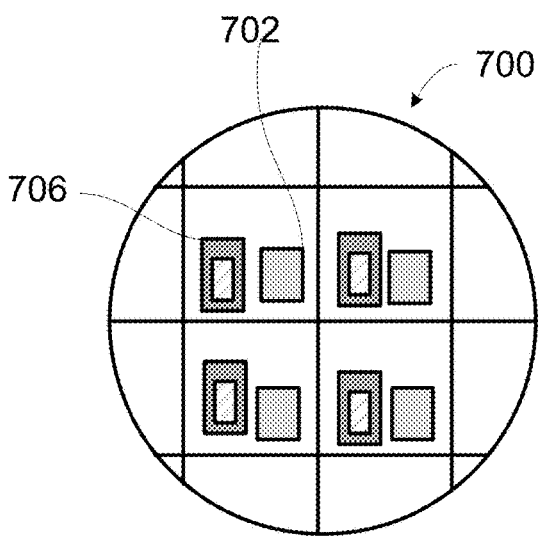
FIG. 7C  FIG. 7D

INTEGRATED MEMS CAVITY SEAL

BACKGROUND OF THE INVENTION

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) devices or sensors such as accelerometers and gyroscopes capture complex movements and determine orientation or direction. For example, smartphones are equipped with accelerometers and gyroscopes to augment navigation systems that rely on Global Position System (GPS) information. In another example, an aircraft determines orientation based on gyroscope measurements (e.g., roll, pitch, and yaw) and vehicles implement assisted driving to improve safety (e.g., to recognize skid or roll-over conditions).

Multiple MEMS sensors may be packaged together in MEMS systems. For example, a MEMS system may have gyroscopes and accelerometers that are packaged together on a common chip and that are physically separated to form distinct cavities. The operations of each sensor may require different pressures within these cavities. For example, a gyroscope may require relatively low pressure (e.g., substantially a vacuum) to operate while an accelerometer may have a higher pressure (e.g., at or near an atmospheric pressure). Applying the appropriate pressure to multiple cavities of the MEMS system may be performed by sealing the MEMS system as a whole at a low (e.g., vacuum) pressure and outgassing to adjust the pressure of higher-pressure cavities. In outgassing, heat may be applied to an oxide film that traps a gas within a particular cavity, which causes the oxide film to allow some gas molecules to be exchanged with the cavity. However, outgassing is both difficult to control to achieve a desired pressure with sufficient accuracy and limited in how much gas may be diffused.

SUMMARY

In some embodiments of the present disclosure, a microelectromechanical (MEMS) system comprises a first MEMS sensor within a first cavity, wherein the first cavity is at a first pressure, a second MEMS sensor within a second cavity, and a MEMS valve within the second cavity. The MEMS valve may comprise an actuator that seals the second cavity at a second pressure different from the first pressure. The first MEMS sensor may comprise a gyroscope and the second MEMS sensor may comprise an accelerometer. The MEMS system may further comprise a cap layer having a through-hole. The MEMS valve may cover the through-hole when the second cavity is sealed. The actuator may apply an electrostatic force to seal the MEMS valve to the cap layer. The electrostatic force may be based on a voltage differential (e.g., 1 to 10 Volts) between the cap layer and the MEMS valve. The actuator may apply thermal energy to seal the MEMS valve to the cap layer. An area of a top plane (e.g., a surface) of the MEMS valve may be at least 75% greater than an area of the through-hole at a lower surface of the cap layer. The through-hole may form a circular hole or a rectangular hole. The MEMS valve may comprise a rectangular surface that covers the circular hole or the rectangular hole. The MEMS valve may comprise a circular surface that covers the circular hole or the rectangular hole. The first pressure may be within a range of vacuum to 2 standard atmospheres. The second pressure may be within a range of vacuum to 2 standard atmospheres. The sealed second cavity may contain an inert gas from at least one selected from a group of nitrogen, radon, helium, krypton, argon, and xenon. The contact length of the MEMS valve to a bottom plane of the cap layer may be greater than a mean free path of the inert gas. The MEMS system may further comprise a plurality of MEMS valve springs attached to the MEMS valve. The plurality of MEMS valve springs may be flexible to facilitate movement along an axis perpendicular to a lower surface of the cap layer. The plurality of MEMS valve springs may limit the movement of the MEMS valve within a plane that is parallel to the lower surface of the cap layer. The MEMS system may further comprise a third MEMS sensor within the second cavity. The second MEMS sensor and third MEMS sensor may both be sealed within the second cavity at the second pressure. A chemical vapor deposition (CVD) layer (e.g., a layer created through CVD) may be applied to the cap layer and the MEMS valve.

In some embodiments of the present disclosure, a method for creating a MEMS system with two cavities at different pressures comprises sealing a first cavity of a first MEMS sensor at a first pressure, etching a through-hole in a cap layer to access a second cavity, applying a second pressure to the second cavity via the through-hole, and actuating a MEMS valve within the second cavity to seal the second cavity at the second pressure. The second cavity may be sealed after the first cavity is sealed. The first MEMS sensor may comprise a gyroscope, the second MEMS sensor may comprise an accelerometer, the first pressure may be substantially vacuum, and the second pressure may be substantially atmospheric. The first MEMS sensor may comprise an accelerometer, the second MEMS sensor may comprise a gyroscope, the first pressure may be substantially atmospheric, and the second pressure may be substantially vacuum.

In some embodiments of the present disclosure, a MEMS system may comprise a first MEMS sensor within a first cavity, a second MEMS sensor within a second cavity, a first MEMS valve in the first cavity, and a second MEMS valve in the second cavity. The first MEMS valve may comprise a first actuator that seals the first cavity at a first pressure. The second MEMS valve may comprise a second actuator that seals the second cavity at a second pressure. The second pressure may be different from the first pressure. The MEMS system may further comprise a third MEMS valve in the third cavity. The third MEMS valve may comprise a third actuator that seals the third cavity at a third pressure. The third pressure may be different from the first pressure and the second pressure. The first actuator may seal the first cavity during a first processing step. The second actuator may seal the second cavity during a subsequent processing step.

BRIEF DESCRIPTION OF DRAWINGS

The above and other features of the present disclosure, its nature and various advantages will be more apparent upon consideration of the following detailed description, taken in conjunction with the accompanying drawings in which:

FIGS. 7A-7D depict a process for sealing a cavity of a MEMS system within a chip of a wafer.

DETAILED DESCRIPTION OF DRAWINGS

Figure 1:
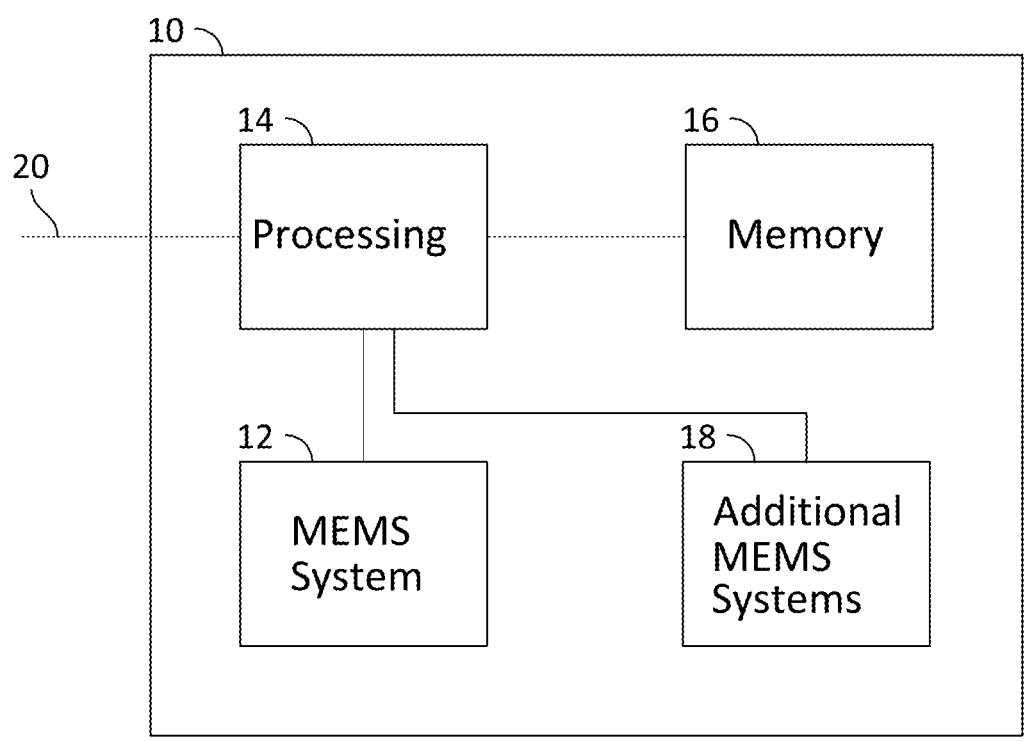
FIG. 1 depicts a block diagram of an exemplary integrated MEMS package having multiple sensors in accordance with at least some embodiments of the present disclosure.

Microelectromechanical systems (MEMS) may refer to a class of structure or devices fabricated using semiconductor-like processes and exhibiting mechanical characteristics such as the ability to move or deform. MEMS often, but not always interact with electrical signals. MEMS devices include, but are not limited to, gyroscopes, accelerometers, magnetometers, pressure sensors, ultrasonic sensors, and radio-frequency components. A MEMS device may include multiple layers fabricated with semiconductor processes, with the layer that includes movable MEMS structures referred to as a MEMS layer.

A MEMS system include multiple MEMS devices that may be fabricated on a single chip such that the chip includes multiple cavities that each contain at least one MEMS device. Each of the MEMS devices may require a specific pressure or range of pressures to operate properly. The MEMS system described herein is directed to integrated MEMS cavity seals to apply desired pressures to different cavities of a MEMS system using through-holes that are sealed by MEMS valves.

In some embodiments, one or more MEMS valves may be fabricated into one or more portions of a MEMS system such that the MEMS valves may seal particular cavities at desired pressures. For example, a MEMS device having a gyroscope in a first cavity and an accelerometer in a second cavity may have the two cavities isolated from each other (e.g., a barrier fabricated within the MEMS system isolates one cavity from the other). During fabrication, at least the first cavity may be sealed at a first (e.g., vacuum) pressure. A through-hole in a layer or layers of the MEMS device (e.g., a cap layer) may be etched to expose the second cavity to introduce a gas and achieve a desired pressure within the second cavity. The gas introduced into the cavity via the through-hole may be an inert gas (e.g., nitrogen or xenon) or any suitable gas for applying pressure to a MEMS system cavity. Because the first cavity is already sealed and is isolated from the second cavity, the pressure within the first cavity does not change.

The shape of a through-hole in the MEMS system may be circular, rectangular, or any suitable shape (e.g., as created by a suitable etching process) for applying a pressure via the through-hole and sealing the pressure with a MEMS valve. The MEMS valve may include a circular surface, rectangular surface, or any suitably shaped surface (e.g., fabricated using MEMS fabrication techniques) that covers the through-hole and is in contact with a lower surface of the layer that includes the through hole. In some embodiments, the contact length of the MEMS valve to this lower surface is greater than a mean free path of the inert gas. For example, the MEMS valve contact length between any two points on the surface of the MEMS valve that contacts the bottom plane of the cap layer is greater than the mean free path of xenon at standard temperature and pressure (STP) of 37.88 nanometers. The forces of stiction that contribute to the seal between the MEMS valve and the cap layer may increase as the area of the bottom plane of the cap layer is covered by the MEMS valve. In some embodiments, the area of the top plane of the MEMS valve is at least 75% greater than an area of the through-hole at a bottom plane. For example, the area of a circular through-hole of 1.5 square micrometers is sealed by a MEMS valve having a top plane with an area of at least 2.625 square micrometers.

Once the desired pressure (e.g., substantially atmospheric pressure) is achieved, the second cavity may be sealed at the through-hole using the MEMS valve. The MEMS valve may comprise an actuator that seals the second cavity at the desired pressure. MEMS valve springs that are flexible in the direction needed to create the seal (e.g., along the z-axis) may suspend the MEMS valve such that the actuator is limited in its movement within a plane parallel to the lower surface of cap layer while movable along the axis perpendicular to the lower surface of the cap layer. In some embodiments, the through-hole is sealed electrostatically. For example, the actuator (e.g., of the MEMS system or applied during the fabrication process) applies a voltage differential (e.g., a voltage differential in a range of 1-10 V) between the MEMS valve and the cap layer to seal the second cavity. In some embodiments, in an additional step, a thermal energy is applied by the actuator to seal the second cavity by applying joule heating current through the actuator to weld the surfaces of the cap and device layer. For example, a voltage is applied to actuate the MEMS valve and continuously applied for an extended period to generate heat to weld the cap layer and the MEMS valve together. In some embodiments, a large voltage differential generates a large enough current that actuates the MEMS valve and generates heat at the interface of the cap layer and the MEMS valve to seal them together.

After the MEMS valve seals the second cavity, the sensor in the first cavity is sealed at the first pressure (e.g., a gyroscope at substantially vacuum pressure) and the sensors in the second cavity (e.g., an accelerometer) are sealed at a second pressure (e.g., substantially atmospheric pressure). As referred to herein, "substantially vacuum pressure" should be understood to mean a pressure that is approximately 0.1 Pa or less while "substantially atmospheric pressure" should be understood to mean a pressure that is approximately 101 kPa. In some embodiments, a third sensor (e.g., another accelerometer) can be in the second cavity with the accelerometer and sealed at the second pressure.

In some embodiments, the MEMS system may include multiple cavities and multiple MEMS valves. For example, a MEMS system may have a MEMS valve in each cavity such that each cavity is sealed by its respective MEMS valve at a desired pressure. In some embodiments, the MEMS system includes multiple through-holes etched for the various cavities within the MEMS system. The through-holes may be etched in varying shapes and sealed at varying times to accommodate for desired pressures, sealing configurations that require different forces (e.g., stiction) to maintain the seal between the MEMS valve and the cap layer, voltage differential requirements for different cap layer and MEMS valve combinations, and suitable combinations thereof. In some embodiments, the etched through-holes are sealed sequentially such that a first actuator seals a first cavity during a first processing step, a second actuator seals a second cavity during a subsequent processing step, etc.

In some embodiments, an additional layer (e.g., a layer created through chemical vapor deposition (CVD)) is applied after the sealing of the MEMS valve via the through hole. The additional layer may at least partially fill the through hole and contact the MEMS valve, creating additional sealing forces between the MEMS valve to the cap layer and additional sealing of the second cavity. Other post-processing such as the application of CVD, thermal oxidation, or a combination thereof, may be applied to the MEMS system.

FIG. 1 depicts a block diagram of an exemplary integrated MEMS package having multiple sensors in accordance with at least some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the MEMS package may include at least a MEMS system 12 and supporting circuitry, such as processing circuitry 14 and memory 16. In some embodiments, one or more additional MEMS systems 18 (e.g., structures, within a chip of a MEMS wafer, having gyroscopes, accelerometers, pressure sensors, and/or a compass or combinations thereof) may be included within the integrated MEMS package 10 to provide an integrated sensor processing unit (e.g., including 3 axes of MEMS gyroscope sensing, 3 axes of MEMS accelerometer sensing, pressure sensor, and compass).

Processing circuitry 14 may include one or more components providing necessary processing based on the requirements of the MEMS package 10. In some embodiments, processing circuitry 14 may include hardware control logic that may be integrated within a chip of a MEMS wafer (e.g., on a substrate or cap of a MEMS device within MEMS system 12 or additional MEMS systems 18, or on an adjacent portion of a chip having MEMS system 12 or additional MEMS systems 18) to control the operation of MEMS system 12 or additional MEMS systems 18 and perform aspects of processing for MEMS system 12 or additional MEMS systems 18. In some embodiments, the MEMS system 12 and additional MEMS systems 18 may include one or more registers that allow aspects of the operation of hardware control logic to be modified (e.g., by modifying a value of a register). For example, in some embodiments, registers may be modified to change values (e.g., resistors, capacitors, filters, etc.) associated with the processing circuitry described herein. In some embodiments, processing circuitry 14 may also include a processor such as a microprocessor that executes software instructions, e.g., that are stored in memory 16. The microprocessor may control the operation of MEMS system 12 by interacting with the hardware control logic, and process signals received from MEMS system 12. The microprocessor may interact with other sensors in a similar manner.

Figure 2A:
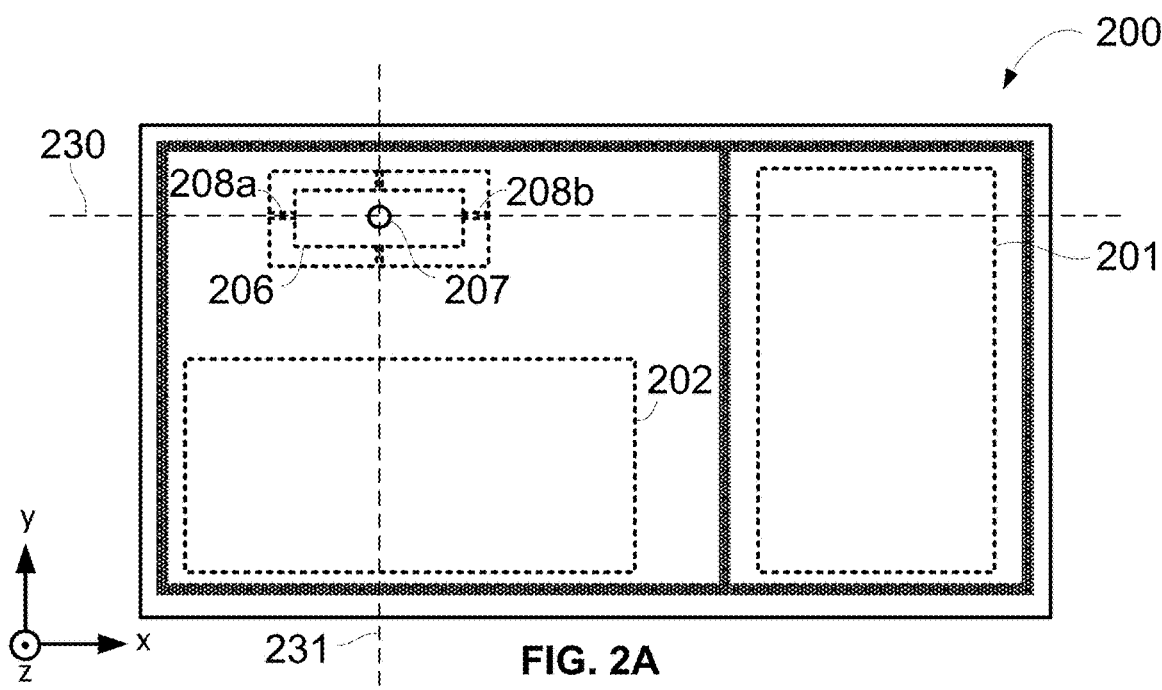
FIG. 2A depicts a top view of an exemplary MEMS system having multiple sensors in accordance with at least some embodiments of the present disclosure.

FIG. 2A depicts a top view of an exemplary MEMS system 200 having multiple sensors in accordance with some embodiments of the present disclosure. Although MEMS system 200 may be described as including a particular configuration of certain types of sensors, it will be understood that other configurations, number of sensors or other MEMS devices, sensor types, and MEMS valves may be utilized in accordance with the present disclosure as described herein. Section line 230 through the top view of MEMS system 200 is drawn such that, when followed, shows a first cross-sectional view of MEMS system 200 depicted in FIG. 2B. Section line 231 through the top view of MEMS system 200 is drawn such that, when followed, shows a second cross-sectional view of MEMS system 200 depicted in FIG. 2C.

MEMS system 200 comprises MEMS sensors 201 and 202 that may be packed together on a common chip. MEMS sensors 201 and 202 are depicted using dashed lines to illustrate that there is a cap layer over MEMS sensors 201 and 202, depicted as cap layer 210 in FIG. 2B, that covers MEMS sensors 201 and 202. A MEMS device or sensor that may be any one or more of sensors 201 and 202 includes a gyroscope, accelerometer, pressure sensor, temperature sensor, magnetometer, any suitable MEMS sensor or device, or any combination thereof. MEMS sensors 201 and 202 are physically interfaced with a substrate (e.g., a CMOS layer) that may be the underlying structure of MEMS system 200, the chip on which MEMS system 200 is packaged, and part of a wafer on which the chip is fabricated. In some embodiments, MEMS sensors 201 and 202 are separated from one another in MEMS system 200 by barriers such that the cavities of respective sensors may have pressures differing from one another. For example, MEMS sensor 201 is separated from MEMS sensors 202 by at least one barrier. In this way, the cavity of MEMS sensor 201 may have a pressure different from the pressure of the cavity of MEMS sensors 202. Barriers separating MEMS sensors are further described in the description for FIG. 2B.

MEMS valve 206 within a cavity of MEMS system 200 may have a shape such that MEMS valve 206 covers through-hole 207. The MEMS valve may include a circular surface, a rectangular surface, or any suitably shaped surface to cover through-hole 207. MEMS valve 206, depicted in FIG. 2 as rectangular, may cover the lower surface of either a circular or rectangular through-hole. For example, through-hole 207, depicted in FIG. 2 as circular, is etched to have a diameter of 1-20 microns. To cover through-hole 207, MEMS valve 206 has a surface area sufficiently greater than the area of the through-hole at the bottom surface of the cap layer (e.g., approximately 7.85 square millimeters for a 100 µm diameter). In some embodiments, a sufficiently great surface area of the MEMS valve is a surface area that is at least 75% greater than an area of the through-hole at the bottom surface of the cap layer. For example, MEMS valve 206 may have a surface area of at least 540 square micrometers (e.g., approximately 175% of the surface area of a through-hole having a 20 µm diameter). The contact between surfaces of the MEMS valve and the cap layer will be further described in the description of FIG. 4. MEMS valve 206 may comprise an actuator or a portion thereof that seals a cavity of MEMS system 200. In some embodiments, the actuator of MEMS valve 206 seals a cavity at a select pressure. For example, the actuator of MEMS valve 206 seals a cavity containing MEMS sensors 202 at substantially atmospheric pressure. The actuator may apply respective voltages to the cap layer and MEMS valve 206 (e.g., directly or indirectly by processing equipment) to create an electrostatic force to cause the MEMS valve to move along the z-axis to seal the MEMS valve to the cap layer. In some embodiments, the actuator applies the electrostatic force by applying a voltage difference between the cap layer and MEMS valve 206 to produce the electrostatic force that seals MEMS valve 206 and the cap layer. For example, the actuator applies a voltage difference of 10 V between the cap layer and MEMS valve 206. The actuator is, in some embodiments, electrically coupled to the CMOS layer via a eutectic bond and the cap layer has a top metal layer enabling electrical connection.

In some embodiments, a plurality of MEMS valve springs (e.g., MEMS valve springs 208a and 208b) attach the MEMS valve 206 to stationary portions of the MEMS system such that the movement of the MEMS valve is limited within a plane that is parallel to the lower surface (e.g., within the x-y plane) of the cap layer while flexible along an axis perpendicular to the lower surface (e.g., along the z-axis). For example, MEMS valve springs 208a and 208b possess a z-axis height (e.g., relatively thin) to x-y aspect ratio (e.g., relatively long along one in-plane axis and relatively thin along the other in-plane axis) that allows MEMS valve 206 to move in the axis perpendicular to the lower surface of a cap layer (e.g., cap layer 210 of FIG. 2B) while having limited in-plane movement in the plane parallel to the cap layer.

Through-hole 207 may be created by fabricating a hole (e.g., etching) in the cap layer that has been fabricated over MEMS sensors 201 and 202. The through-hole may be achieved by deep reactive-ion etching (DRIE), potassium hydroxide (KOH) etching, xenon difluoride etching, or any suitable combination thereof. Through-hole 207 may form a circular hole, rectangular hole, or any suitably shaped hole formed by etching through a cap layer. In some embodiments, the through-hole is sized such that a gas of interest has adequate space to travel through through-hole 207 at a rate such that a select pressure may be applied to the cavity of MEMS system 200 by selectively closing MEMS valve 206 covering through-hole 207. For example, an inert gas (e.g., nitrogen or xenon) is introduced into the cavity containing MEMS sensors 202 to such that MEMS sensors 202 operate at the appropriate pressure.

Figure 2B:
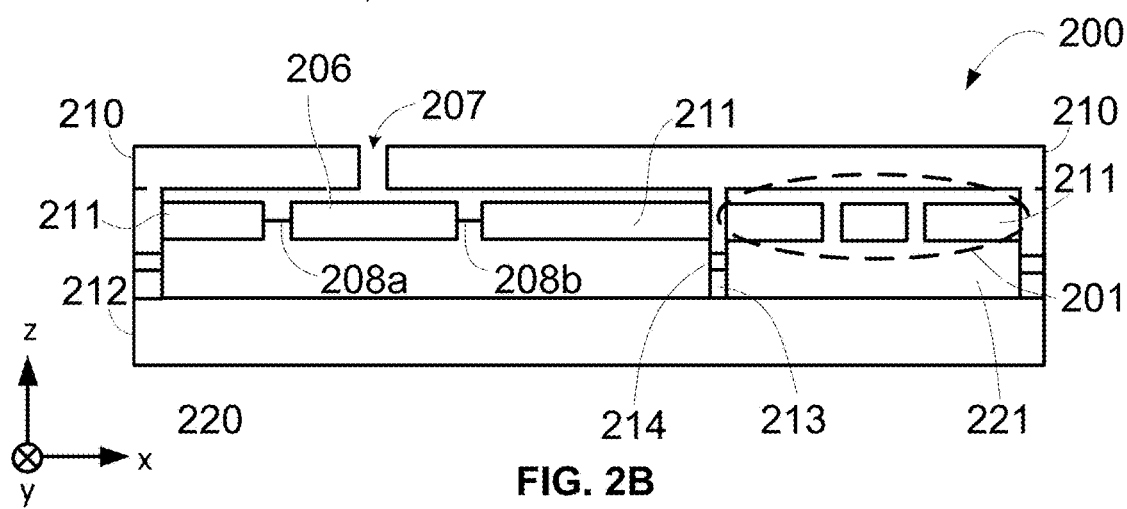
FIG. 2B depicts a first cross-sectional view of the exemplary MEMS system having multiple sensors of FIG. 2A in accordance with at least some embodiments of the present disclosure.

FIG. 2B depicts a first cross-sectional view of exemplary MEMS system 200 having multiple sensors of FIG. 2A in accordance with at least some embodiments of the present disclosure. The cross-sectional view follows section line 230 of FIG. 2A. MEMS sensor 201, MEMS valve 206, through-hole 207, and MEMS valve springs 208a and 208b correspond to like references in FIG. 2A. MEMS valve 206 is depicted in FIG. 2B as prior to being actuated (e.g., before the actuator creates a seal between MEMS valve 206 and cap layer 210).

Cap layer 210, depicted in FIG. 2B as covering MEMS sensor 201, may cover multiple MEMS sensors in MEMS system 200. 201 and 202 In some embodiments, cap layer 210 is fabricated over MEMS layer 211 to cover MEMS layer 211 containing MEMS valve 206. Through-hole 207 may be etched through cap layer 210.

In some embodiments, MEMS layer 211 comprises MEMS valve 206 and an actuator to seal MEMS valve 206 to cap layer 210. For example, MEMS valve 206 is electrostatically sealed to cap layer 210.

In some embodiments, substrate 212 is a CMOS layer. A CMOS layer may be an external or underlaying electrical layer such that an electrical signal may be applied between MEMS system 200 and an external system such as processing 14 or memory 16. Substrate 212 may include a silicon layer that creates the foundation upon which the MEMS wafer that MEMS system 200 is packaged on is grown.

In some embodiments, a eutectic bond between contact 213 and bonding layer 214 separates cavity 220 and cavity 221 and provides electrical connection from MEMS layer 211 to substrate 212. Contact 213 may be located over substrate 212 and bonding layer 214 may be located over cap layer 210. In some embodiments, contact 213 is an aluminum contact and bonding layer 214 is a germanium layer (i.e., the eutectic bond is an aluminum-germanium (Al—Ge) bond).

In some embodiments, cavity 220 and cavity 221 are initially sealed at a first pressure (e.g., substantially vacuum pressure). A eutectic bond between contact 213 and bonding layer 214 separates cavity 221 and cavity 220 such that a through-hole may be etched through cap layer 210 to change the pressure of cavity 220 without altering the pressure of cavity 221. The MEMS system may be fabricated in a chamber at the first pressure such that both chambers 220 and 221 are both sealed at the first pressure. To apply a second pressure to cavity 220, MEMS system 200 may be in a chamber at the second pressure when through-hole 207 is created such that the second pressure is applied to cavity 220. An illustrative process for applying pressure to a cavity is described in the descriptions of FIGS. 3A-3C.

Figure 2C:
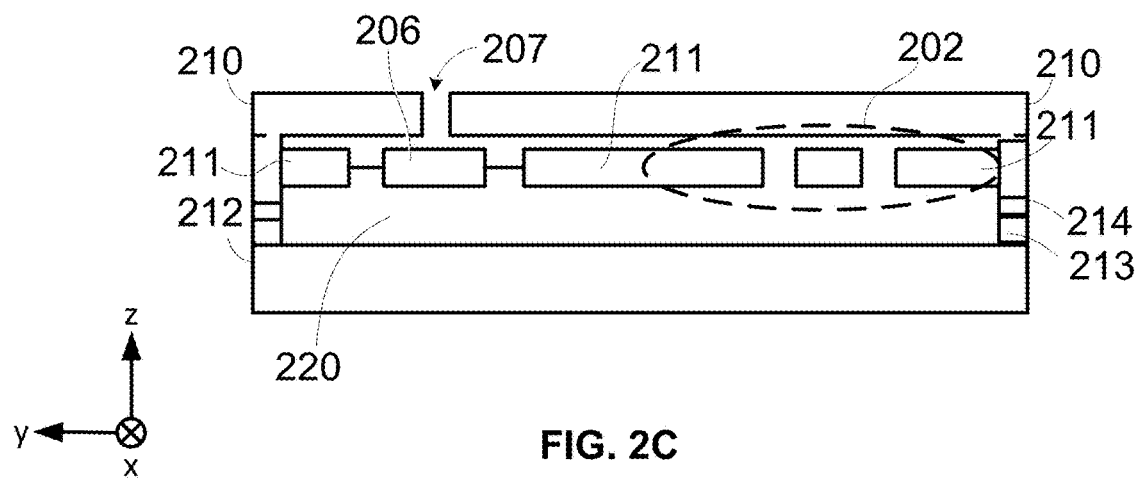
FIG. 2C depicts a second cross-sectional view of the exemplary MEMS system having multiple sensors of FIG. 2A in accordance with at least some embodiments of the present disclosure.

FIG. 2C depicts a second cross-sectional view of exemplary MEMS system 200 having multiple sensors of FIG. 2A in accordance with at least some embodiments of the present disclosure. The cross-sectional view follows section line 231 of FIG. 2A. MEMS sensor 202, MEMS valve 206, and through-hole 207 correspond to like references in FIG. 2A. MEMS valve 206 is depicted in FIG. 2C as prior to being actuated. Though not labeled in FIG. 2C, MEMS valve springs are depicted as attaching MEMS valve 206 to MEMS layer 211.

Figure 3A:
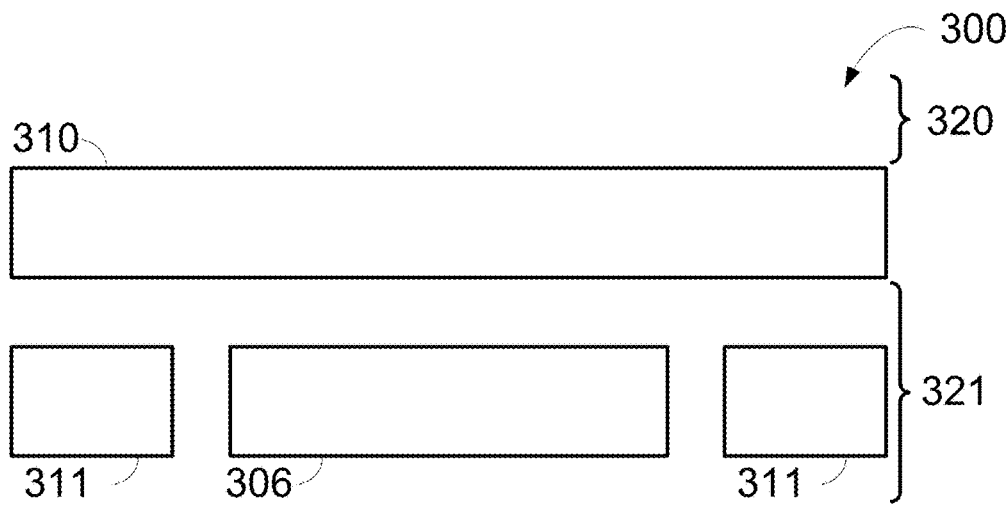
FIGS. 3A-3C depict a process for applying a pressure to and sealing a cavity with the pressure in accordance with at least some embodiments of the present disclosure.
Figure 3B:
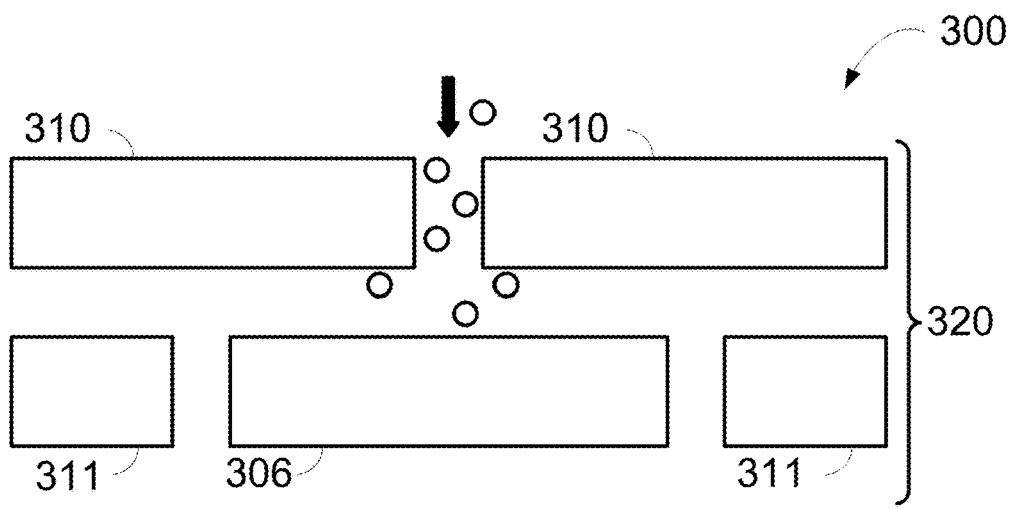
Figure 3C:
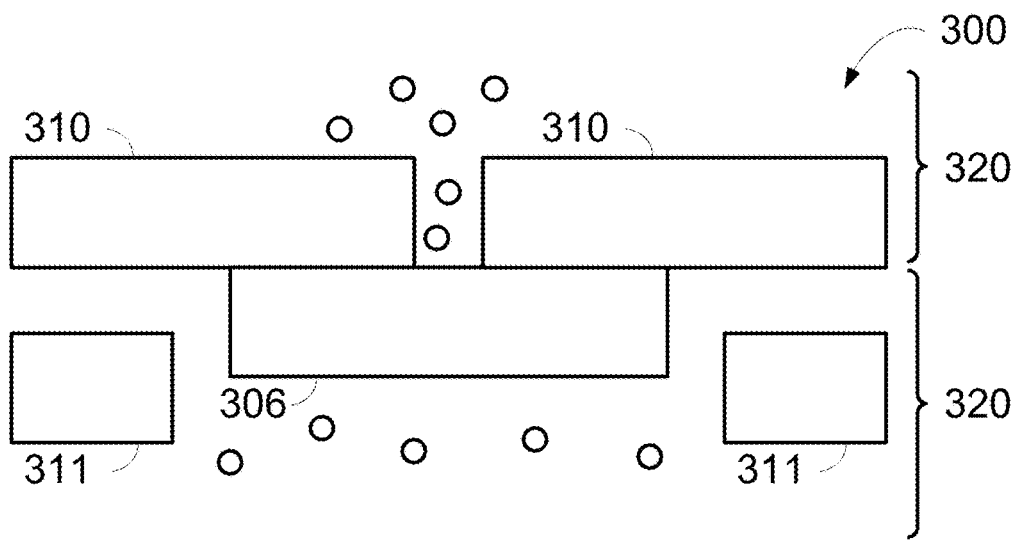

FIGS. 3A-3C depict a process for applying a pressure to and sealing a cavity with the pressure in accordance with at least some embodiments of the present disclosure. Although FIGS. 3A-3C are focused on an area of MEMS system 300 where the cavity is sealed, undepicted MEMS sensors may be within the cavity of MEMS system 300. FIG. 3A depicts a MEMS valve prior to actuation similar to MEMS valve 206 in FIGS. 2A and 2B. After a gas is introduced through a through-hole, as depicted in FIG. 3B, the actuated MEMS valve seals the cavity, as depicted in FIG. 3C.

FIG. 3A shows a cavity having pressure 321 that has been sealed by cap layer 310. Cap layer 310 may cover MEMS sensors of MEMS system 300. In some embodiments, cap layer 310 is fabricated over MEMS layer 311 to cover MEMS layer 311 containing MEMS valve 306. A through-hole may be etched through cap layer 310 as described herein.

Within the cavity, valve 306 is attached to stationary MEMS layer 311 by springs (not depicted in FIGS. 3A-3C). In some embodiments, MEMS layer 311 comprises MEMS valve 306 and an actuator to seal MEMS valve 306 to cap layer 310. For example, MEMS valve 306 is electrostatically sealed to cap layer 310 (e.g., as depicted in FIG. 3C). Although not depicted, MEMS valve 306 may be attached to MEMS layer 311 with a plurality of MEMS valve springs as described in the description of FIGS. 2A and 2B.

Pressure 321 within a cavity of MEMS system 300 is separated from pressure 320 by cap layer 310. In some embodiments, pressure 321 is not the same as pressure 320. For example, MEMS system 300 fabricated in a chamber having pressure 321 when cap layer 310 is fabricated over a cavity, thereby sealing pressure 321 within the cavity. MEMS system 300 can be exposed to pressure 320 afterward (e.g., the chamber pressure changes) such that the pressure on one side of cap layer 310 is pressure 320 and the pressure on the other side of cap layer 310 is pressure 321.

FIG. 3B shows a gas entering a cavity of MEMS system 300 through a through-hole. Gas entering the cavity causes the pressure within the cavity to change from pressure 321 to pressure 320. In some embodiments, the gas is an inert gas (e.g., nitrogen, radon, helium, krypton, argon, or xenon), any suitable gas for applying pressure to a MEMS cavity, or any combination thereof. Gas molecules are depicted in FIG. 3B as traveling into the cavity in the direction of the arrow over the through-hole in cap layer 310.

MEMS valve 306 within a cavity of MEMS system 300 may have a shape such that MEMS valve 306 covers the through-hole through which gas enters the cavity. MEMS valve 306 may include a circular surface, a rectangular surface, or any suitably shaped surface to cover a through-hole. For example, if a through-hole is etched in a circular shape with an area of 2 square micrometers, MEMS valve 306 may have a rectangular shape with a surface area sufficiently greater than the area of the through-hole at the bottom surface of the cap layer. In some embodiments, MEMS valve 306 has a sufficiently great surface area to cover a portion of the lower surface of cap layer 310 that has been fabricated over MEMS layer 311. In some embodiments, a sufficiently greater surface area of MEMS valve 306 is a surface area that is at least 75% greater than an area of the through-hole at the bottom surface of cap layer 310. For example, MEMS valve 306 may have a surface area of at least 6.3 square millimeters (e.g., 175% of the surface area of a rectangular through-hole having an area of 3.6 square millimeters). In some embodiments, MEMS valve 306 has a surface area of approximately 100-10000 square micrometers. The contact between surfaces of MEMS valve 306 and cap layer 310 is further described in the description of FIG. 4.

FIG. 3C shows MEMS valve 306 actuated such that the cavity of MEMS system 300 is sealed at pressure 320. MEMS valve 306 may comprise an actuator that seals a cavity of MEMS system 300. In some embodiments, the actuator of MEMS valve 306 seals the cavity at a select pressure. For example, the actuator of MEMS valve 306 seals the cavity at a pressure within a range of vacuum to 2 standard atmospheres (i.e., 14.69 psi to 29.39 psi). The actuator may apply an electrostatic force to seal MEMS valve 306 to cap layer 310. In some embodiments, the actuator applies the electrostatic force by applying a voltage difference between cap layer 310 and MEMS valve 306 to produce the electrostatic force that seals MEMS valve 306 and the cap layer. For example, the actuator applies a voltage difference of 10 V between cap layer 310 and MEMS valve 306. In some embodiments, an additional layer may be fabricated over sealed MEMS system 300 to further seal and provide protection for MEMS system 300, for example, is described in FIG. 5.

Figure 4:
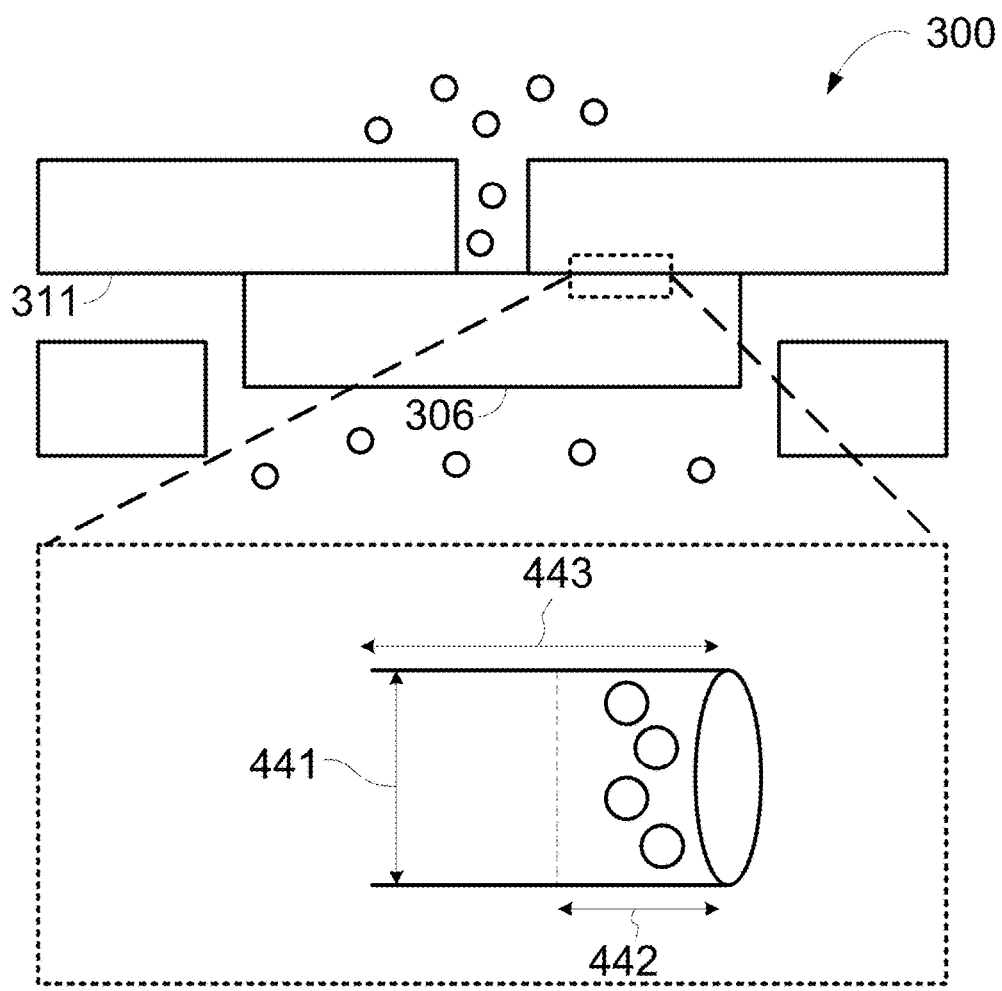
FIG. 4 depicts a cross-sectional view of the MEMS valve of FIG. 3C in accordance with at least some embodiments of the present disclosure.

FIG. 4 depicts a cross-sectional view of the MEMS valve of FIG. 3C in accordance with at least some embodiments of the present disclosure. An enlarged portion of the area of contact between MEMS valve 306 and cap layer 310 is shown within a dashed diagram box.

Contact surface distance 441 is a remaining distance between MEMS valve 306 and cap layer 310 after the cavity has been sealed. In some embodiments, the upper surface of MEMS valve 306 and/or the lower surface of cap layer 310 are not sufficiently smooth such that contact surface distance 441 is zero. The rough surfaces of the upper surface of MEMS valve 306 and/or the lower surface of cap layer 310 may allow a leakage between the surfaces even after MEMS valve 306 has been actuated to seal the cavity.

In some embodiments, stiction between cap layer 310 and MEMS valve 306 caused by van der Waals forces contributes to the sealing of the cavity in MEMS system 300. The leakage may depend upon mean free path 442 of the gas introduced into the cavity and contact length 443 of MEMS valve 306. Mean free path 442 may be based on the gas introduced. For example, the mean free path of argon at STP is 68.33 nm. In some embodiments, contact length 443 is the shortest distance between any two points of contact between cap layer 310 and MEMS valve 306. For example, a circular through-hole having a diameter of 70 nm and MEMS valve covering the circular through-hole at a shared center point and having a diameter of 270 nm have a contact length of 200 nm. In some embodiments, a through-hole is rectangular, and a MEMS valve has a rectangular surface to cover the rectangular through-hole. For a rectangular through-hole having a surface area of 1.4 micrometers (e.g., 20 nm by 70 nm) and the MEMS valve covering the rectangular through-hole at a shared center point and having a surface area of 3 micrometers (e.g., 30 nm by 100 nm) have a contact length of 5 nm (e.g., the difference in distance between a point in the center of the longer edge of the MEMS valve and a point in the center of the longer edge of the through-hole).

In some embodiments, contact length 443 is sufficiently greater than mean free path 442. To achieve a contact length that is sufficiently greater than the mean free path, the rectangular MEMS valve may have (1) a width that is at least 175% a sum of the length of the width of the through-hole and twice the mean free path of the gas used and (2) a height that is at least 175% a sum of the length of the height of the through-hole and twice the mean free path of the gas used. For example, although the rectangular MEMS valve described above has a surface area that is at least 75% greater than the area of the rectangular through-hole described above, 5 nm is not sufficiently greater than 68.33 nm, the mean free path of argon. A rectangular MEMS valve having dimensions of at least 274.16 nm in height and 361.66 nm in width achieves a contact length of at least 127.08 nm. The percentage of 175% is a nonlimiting example of a percentage allowing for contact length 443 to be sufficiently greater than mean free path 442.

Figure 5:
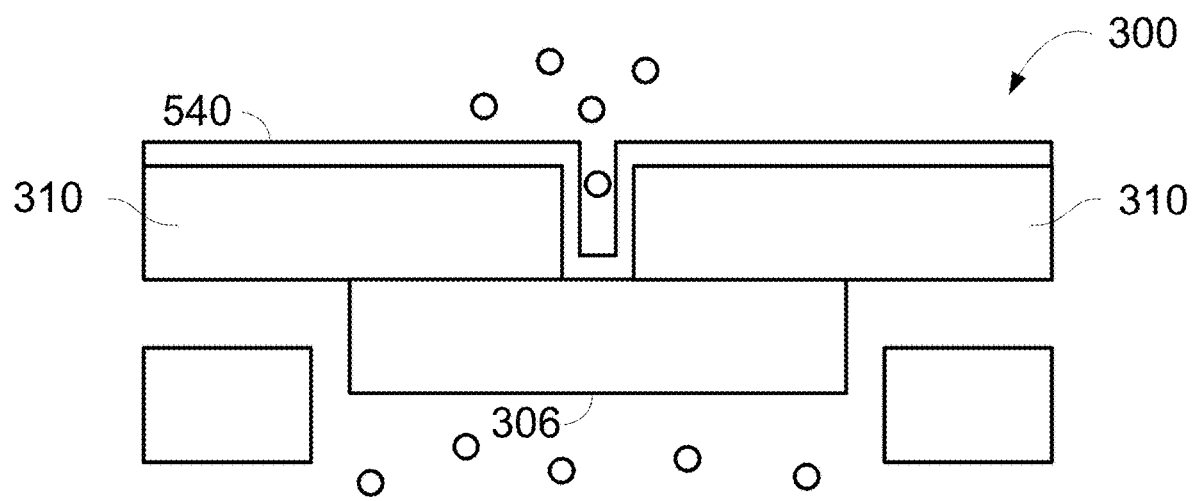
FIG. 5 depicts a cross-sectional view of an additional sealing layer applied to the cap layer and MEMS valve of FIG. 3C in accordance with at least some embodiments of the present disclosure.

FIG. 5 depicts a cross-sectional view of an exemplary additional sealing layer 540 applied to cap layer 310 and MEMS valve 306 of MEMS system 300 of FIG. 3C in accordance with at least some embodiments of the present disclosure. In some embodiments, an additional sealing layer 540 includes various oxides such as tetraethyl orthosilicate (TEOS), high density plasma (HDP) oxide, low pressure chemical vapor deposition (LPCVD) oxide, silicon nitride LPCVD, plasma enhanced CVD (PECVD), metal sputtering, thermal oxide, or any suitable combination thereof. Additional sealing layer 540 has, in some embodiments, a relative thickness of 1 micrometer.

Figure 6:
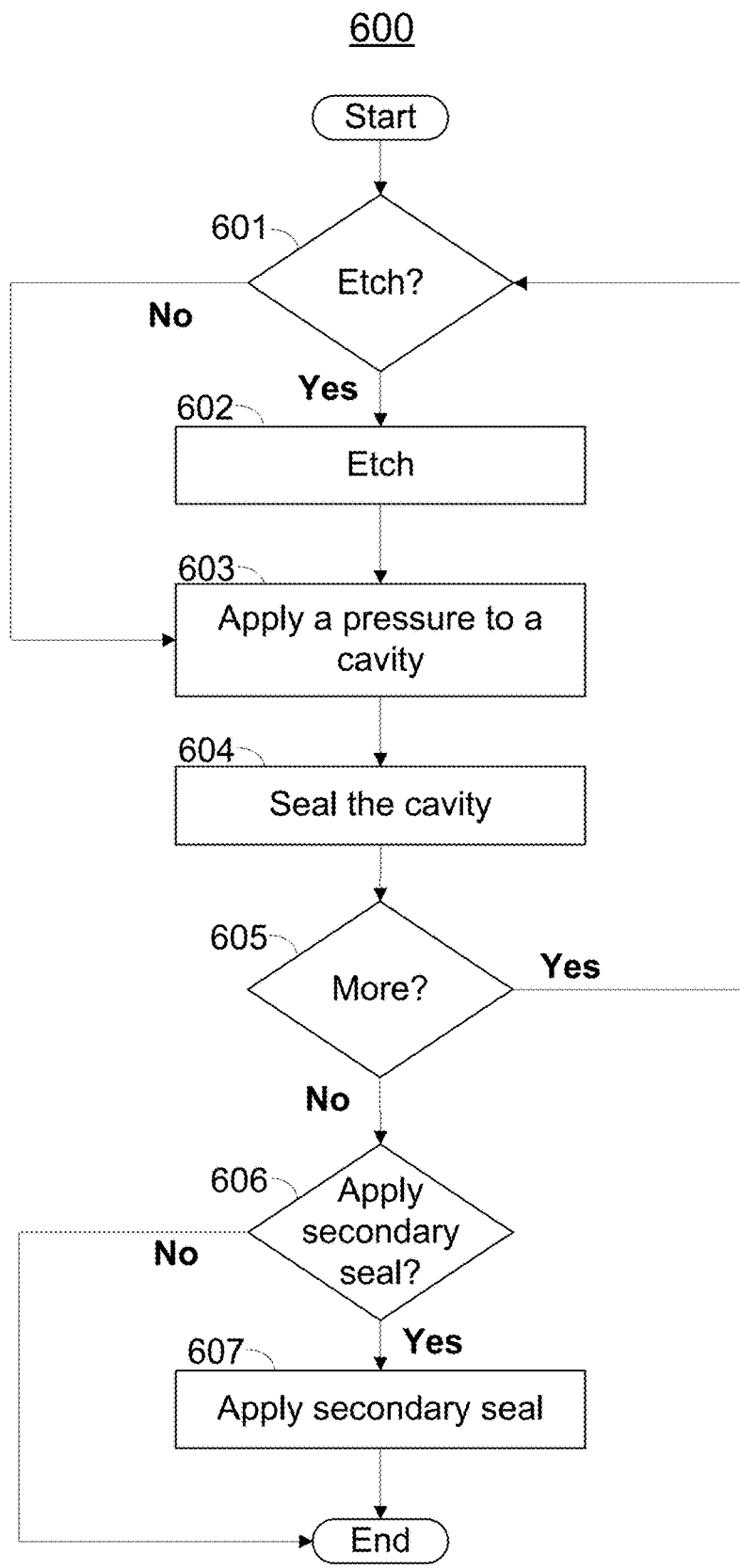
FIG. 6 is a flowchart of an exemplary process for sealing a cavity in a MEMS system in accordance with at least some embodiments of the present disclosure.

FIG. 6 is a flowchart of an exemplary process 600 for sealing a cavity in a MEMS system in accordance with at least some embodiments of the present disclosure. The process shown in FIGS. 3A-3C may be achieved through steps included in process 600. MEMS system 300 of FIG. 5 may be achieved through the steps of process 600. Although FIG. 6 is described in the context of the present disclosure, it will be understood that the methods and steps described in FIG. 6 may be applied to a variety of MEMS cavities and sealing techniques. Although a particular order and flow of steps is depicted in FIG. 6, it will be understood that in some embodiments one or more of the steps may be modified, moved, removed, or added, and that the flow depicted in FIG. 6 may be modified. For example, a process may begin with sealing a cavity before determining whether to etch a through-hole. It should be noted that although the term "etch" is used in process 600, any suitable method for creating a through-hole in a MEMS system may be used. For example, a through-hole may be created using a laser or focus ion beam (FIB).

At step 601, the system determines whether to etch a through-hole through a layer sealing a MEMS cavity (e.g., a cap layer). For example, a MEMS system comprising a gyroscope in a first cavity and an accelerometer in a second cavity are sealed at a first pressure (e.g., at substantially vacuum pressure). The system determines that the pressure of the cavity having the accelerometer is to be at a different pressure (e.g., at substantially atmospheric pressure) than the previously sealed pressure of the gyroscope (e.g., a vacuum). The system proceeds to step 602 because a through-hole is to be etched to change the pressure of the cavity having the accelerometer. In step 602, the system uses any manner of etching or creating a through-hole described herein to create the through-hole. If the system determines that etching is not needed (e.g., a through-hole already exists within a cap layer over the accelerometer), the system proceeds directly to step 603 to apply a pressure to the cavity having the accelerometer.

At step 603, the system applies a pressure to a cavity. In some embodiments, a pressure within a range of vacuum to 2 standard atmospheres may be applied to a cavity. For example, a pressure of 2 atmospheres is applied to the cavity having the accelerometer. In some embodiments, a MEMS system is fabricated in a chamber having a selectable pressure using an appropriate gas. An inert gas such as nitrogen, radon, helium, krypton, argon, xenon, or any suitable combination thereof may be used to apply a pressure to the cavity. Methods for applying pressure to a cavity are described in the description of FIG. 3B.

At step 604, the system seals the cavity. In some embodiments, the MEMS system includes a MEMS layer with a MEMS valve and actuator. The actuator may apply an electrostatic force, thermal, or any suitable force to seal the upper surface of the MEMS valve to the lower surface of the cap layer through which the through-hole was etched in step 602. For example, a voltage differential is applied between a MEMS valve (e.g., MEMS valve 206) in the cavity having the accelerometer and the cap layer over the accelerometer such that the MEMS valve seals the through-hole. The voltage differential may cause the MEMS valve to move towards the bottom surface of the cap layer because MEMS valve springs attached to the MEMS valve allow for flexibility within the axis perpendicular to the bottom surface of the cap layer while limiting movement in a plane parallel to the bottom surface of the cap layer.

At step 605, the system determines whether there are more cavities that should be sealed at a selected pressure. If the system determines more cavities should be sealed (e.g., additional MEMS sensors that require a different pressure or the same pressure but in a different cavity), the system returns to step 601 to repeat steps of process 600. If the system determines there are no more cavities to be sealed, the system proceeds to step 606 to determine whether a secondary seal is to be applied over the sealed cavities accomplished by step 604.

At step 606, the system may determine to apply a secondary seal over the sealed cavities of the MEMS system, proceeding to step 607 to apply the secondary seal. A secondary seal includes a layer created through CVD or any suitable non-structural film or layer fabricated over a structural cap layer. A non-structural layer may be any layer that is not critical to the structural integrity of the MEMS chip on which the layer is fabricated. If the system, at step 606, determines no secondary seal is to be applied, process 600 is terminated.

In some embodiments, a MEMS system including both a gyroscope and accelerometer are sealed in an order such that the accelerometer is sealed at a first pressure (e.g., substantially atmospheric) before the gyroscope is sealed at a second pressure (e.g., substantially vacuum). Prior to beginning process 600, both the gyroscope and accelerometer may be sealed at a substantially atmospheric pressure. At step 601, the system may determine that a through-hole is to be etched in the cap layer over the gyroscope. At step 602, the system may etch a through-hole such that the pressure of the cavity having the gyroscope changes to substantially vacuum pressure. For example, the chamber in which the MEMS system is fabricated may be altered such that the pressure of the chamber is substantially vacuum. At step 604, the system may seal the cavity having the gyroscope by applying an electrostatic force to a MEMS valve in the cavity with the gyroscope such that the gyroscope is sealed at substantially vacuum pressure. At step 605, the system may determine that the MEMS sensors of the MEMS system are sealed at appropriate pressures, proceeding to step 606.

At step 606, the system determines whether to apply a secondary seal. In some embodiments, a secondary seal may be a protective layer fabricated through CVD, for example, as described and depicted for FIG. 5 herein. If the system determines a secondary seal is needed, the system proceeds to step 607 to apply the secondary seal.

A MEMS system may have a cavity with two MEMS sensors. For example, a first cavity may contain a gyroscope and a second cavity may contain an accelerometer and a magnetometer. Through process 600, the first cavity containing the gyroscope may be sealed at a substantially vacuum pressure and the second cavity containing both the accelerometer and the magnetometer may be sealed at a substantially atmospheric pressure. The first cavity may, without the involvement of a through-hole, may be sealed at a substantially vacuum pressure before the second cavity is sealed. At step 601, the system may determine etching is not needed because a through-hole already exists for the second cavity and proceed to step 603. At step 603, the system applies a substantially atmospheric pressure to the second cavity (e.g., an inert gas is introduced to achieve a pressure of 1.5 standard atmospheres). At step 604, the system seals the second cavity by actuating a MEMS valve in the second cavity. At step 605, the system determines that the MEMS sensors of the MEMS system are sealed at appropriate pressures, proceeding to step 606. At step 606, the system determines that a secondary seal created through CVD is to be applied and deposits the secondary seal at step 607.

FIGS. 7A-7D depict a process for sealing a cavity of a MEMS system within a chip of wafer 700. Wafer 700, ultimately packaged with MEMS sensors, undergoes at least one sealing process to create a first cavity containing a MEMS sensor at a first pressure that is isolated from a second cavity containing a MEMS sensor at a second pressure. An additional sealing layer may be fabricated upon wafer 700 to support the sealing of a cavity by a MEMS valve within wafer 700.

FIG. 7A shows MEMS device prior to sealing with unsealed MEMS sensors 706 and 702 of a MEMS system within a chip of wafer 700. Similar to MEMS sensors 201 and 202 of FIG. 2A, MEMS sensors 706 and 702 may be a gyroscope, accelerometer, magnetometer, pressure sensor, radio-frequency component, or any suitable sensor. Additional sensors selected from the MEMS sensors above may be packaged within wafer 700 although not depicted. Components of FIG. 1 such as processing circuitry or memory may also be packaged within wafer 700.

FIG. 7B shows sealed MEMS sensors 702 and 706 of wafer 700. A cap layer and a MEMS device layer may be bonded at a first pressure over the cavity containing unsealed MEMS sensor 702 and 706 to result in sealed MEMS sensors 702 and 706 at a first pressure. As depicted in FIG. 7B, the shading of MEMS sensors 702 and 706 is indicative of a first pressure applied to a cavity containing sealed MEMS sensor 702 and 706. At the time of the sealing of the first and second sensors 702 and 706, both sensors may be at the same pressures (indicated by shading).

FIG. 7C shows a step of creating a through-hole in a cap of the sensor 706, such that it is no longer at the first pressure. The through-hole may be created (e.g., etched) in a cap layer over a MEMS valve 706a (depicted in FIG. 7C and FIG. D as exposing them MEMS valve 706a, although it will be understood that the through hole has a smaller area than the MEMS valve 706a to facilitate sealing of MEMS valve 706a) of the sensor 706 and the pressure of the sensor 706 may be whatever pressure is located outside of the cap of pressure sensor 706. The seal of sensor 702 is unaffected by the through hole.

FIG. 7D shows a cavity sealed by actuating the MEMS valve 706a of sensor 706. In some embodiments, the MEMS sensor 706 includes an actuator that applies a voltage differential to the cap and device layers so as to seal the MEMS valve 706a over the through-hole. A pressure such as a substantially atmospheric pressure applied into the cavity before sealing of the MEMs valve 706a may thereby be sealed within the cavity. MEMS valve 706b is shown in FIG. 7D with lines to indicate that MEMS valve 706b is in a sealed state and the MEMS sensor 706 is shown with different shading than MEMS sensor 702 to indicate the different pressures of the sensors. For example, the actuator associated with MEMS valve 706a applies a voltage differential to MEMS valve 706b such that MEMS valve 706a covers the through-hole created in the cap layer over the cavity. After MEMS valve 706 seals the cavity, an additional sealing such may be fabricated over wafer 700 through CVD to add another layer of sealing and protection to the sealed cavities in some embodiments.

The above-described embodiments of the present disclosure are presented for purposes of illustration and not of limitation, and the present disclosure is limited only by the claims that follow. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

What is claimed is:

1. A microelectromechanical (MEMS) system, comprising:
    a first MEMS sensor within a first cavity, wherein the first cavity is at a first pressure;
    a second MEMS sensor within a second cavity;
    a cap covering the second MEMS sensor, the cap comprising an upper surface, a lower surface, and a through-hole between the upper surface and the lower surface, wherein the lower surface is closer to the second sensor than the upper surface is; and
    a MEMS valve within the second cavity configured to move to cover the through-hole at the lower surface of the cap such that the MEMS valve seals the second cavity at a second pressure different from the first pressure based on the movement.

2. The system of claim 1, wherein the first MEMS sensor comprises a gyroscope and the second MEMS sensor comprises an accelerometer.

3. The system of claim 1, wherein an electrostatic force is applied to the MEMS valve to seal the MEMS valve to the cap.

4. The system of claim 3, wherein the electrostatic force is based on a voltage differential of 1 to 10 Volts between the cap and the MEMS valve.

5. The system of claim 1, wherein a chemical vapor deposition (CVD) layer is applied to the cap and the MEMS valve.

6. The system of claim 1, wherein thermal energy is applied to the MEMS valve to seal the MEMS valve to the cap.

7. The system of claim 1, wherein an area of a top plane of the MEMS valve is at least 75% greater than an area of the through-hole at a bottom plane of the cap.

8. The system of claim 1, wherein the through-hole forms a circular hole or a rectangular hole.

9. The system of claim 8, wherein the MEMS valve comprises a rectangular surface that covers the circular hole or the rectangular hole.

10. The system of claim 8, wherein the MEMS valve comprises a circular surface that covers the circular hole or the rectangular hole.

11. The system of claim 1, wherein the first pressure is substantially a vacuum and the second pressure is substantially at atmospheric pressure.

12. The system of claim 1, wherein the sealed second cavity contains an inert gas selected from at least one of a group of nitrogen and xenon.

13. The system of claim 12, wherein a contact length of the MEMS valve to a bottom plane of the cap is greater than a mean free path of the inert gas.

14. The system of claim 1, further comprising a plurality of MEMS valve springs attached to the MEMS valve, wherein the plurality of MEMS valve springs are flexible to facilitate movement along an axis perpendicular to a lower surface of the cap.

15. The system of claim 14, wherein the plurality of MEMS valve springs limit the movement of the MEMS valve within a plane that is parallel to the lower surface of the cap.

16. The system of claim 1, further comprising a third MEMS sensor within the second cavity, wherein the second MEMS sensor and the third MEMS sensor are both sealed within the second cavity at the second pressure.

17. The system of claim 14, further comprising a MEM layer, wherein the MEMS valve is formed within the MEMS layer and is attached to a stationary portion of the MEMS layer by the MEMS valve springs.

* * * * *